US009097392B2

(12) United States Patent
Bertram et al.

(10) Patent No.: US 9,097,392 B2
(45) Date of Patent: Aug. 4, 2015

(54) MIXED LIGHT SOURCE

(75) Inventors: Ralph Peter Bertram, Nittendorf (DE); Ralph Wirth, Lappersdorf (DE); Jan Marfeld, Regensburg (DE)

(73) Assignee: OSRAM GmbH, Munich (DE)

( * ) Notice: Subject to any disclaimer, the term of this patent is extended or adjusted under 35 U.S.C. 154(b) by 667 days.

(21) Appl. No.: 13/499,524

(22) PCT Filed: Jul. 15, 2010

(86) PCT No.: PCT/EP2010/060255
§ 371 (c)(1),
(2), (4) Date: Aug. 13, 2012

(87) PCT Pub. No.: WO2011/038948
PCT Pub. Date: Apr. 7, 2011

(65) Prior Publication Data
US 2012/0305953 A1 Dec. 6, 2012

(30) Foreign Application Priority Data

Sep. 30, 2009 (DE) .................... 10 2009 047 789

(51) Int. Cl.
*H01L 33/50* (2010.01)
*F21K 99/00* (2010.01)
*F21Y 101/02* (2006.01)
(Continued)

(52) U.S. Cl.
CPC . *F21K 9/135* (2013.01); *F21K 9/50* (2013.01); *H01L 33/501* (2013.01); *H01L 33/502* (2013.01); *H01L 33/504* (2013.01); *F21Y 2101/02* (2013.01); *F21Y 2113/005* (2013.01); *H01L 25/0753* (2013.01); *H01L 33/50* (2013.01)

(58) Field of Classification Search
CPC ..... H01L 33/50; H01L 33/501; H01L 33/502; H01L 33/507; H01L 33/508; H01L 25/0753
USPC .................... 257/89, 98, E27.12, E33.061
See application file for complete search history.

(56) References Cited

U.S. PATENT DOCUMENTS 6,153,971 A * 11/2000 Shimizu et al. ............... 313/486
7,213,940 B1    5/2007 Van de Ven et al.
(Continued)

FOREIGN PATENT DOCUMENTS

CN          1326230      12/2001
DE    10 2009 022 070    11/2010
(Continued)

OTHER PUBLICATIONS

Lumitch PI-LED (with English translation) presentation of Nov. 28, 2007, http://www.lumitech.at/0uploads/dateien22.pdf.
(Continued)

*Primary Examiner* — Marvin Payen
*Assistant Examiner* — Jeremy Joy
(74) *Attorney, Agent, or Firm* — Cozen O'Connor

(57) ABSTRACT

A mixed light source comprising: a first radiation source, which emits radiation in the red spectral range; an excitation source, which contains a III-V semiconductor material; and a conversion substance, which, during the operation of the mixed light source, converts the radiation of the excitation source at least partly into radiation whose color locus in the CIE chromaticity diagram lies within a polygon spanned by the coordinates (0.1609; 0.497), (0.35; 0.6458), (0.558; 0.444) and (0.453; 0.415).

12 Claims, 3 Drawing Sheets

(51) Int. Cl.
  *F21Y 113/00*   (2006.01)
  *H01L 25/075*   (2006.01)

(56) References Cited

U.S. PATENT DOCUMENTS

| | | |
|---|---|---|
| 2002/0070681 A1* | 6/2002 | Shimizu et al. ............... 315/246 |
| 2004/0188700 A1* | 9/2004 | Fukasawa et al. ............ 257/100 |
| 2004/0217364 A1* | 11/2004 | Tarsa et al. ...................... 257/89 |
| 2005/0082974 A1 | 4/2005 | Fukasawa et al. |
| 2005/0117334 A1* | 6/2005 | Lee et al. ...................... 362/231 |
| 2005/0127381 A1 | 6/2005 | Vitta et al. |
| 2007/0159064 A1* | 7/2007 | Choi et al. .................... 313/502 |
| 2007/0223219 A1* | 9/2007 | Medendorp et al. .......... 362/231 |
| 2008/0304260 A1* | 12/2008 | Van De Ven et al. ......... 362/231 |
| 2008/0310154 A1* | 12/2008 | Van De Ven et al. ......... 362/231 |

FOREIGN PATENT DOCUMENTS

| | | |
|---|---|---|
| EP | 1 160 883 | 12/2001 |
| EP | 1 462 711 | 8/2002 |

OTHER PUBLICATIONS

Schubert E. F.; "Light Emitting Diodes" Second Edition; New York, Cambridge University Press; 2006, p. 302.

\* cited by examiner

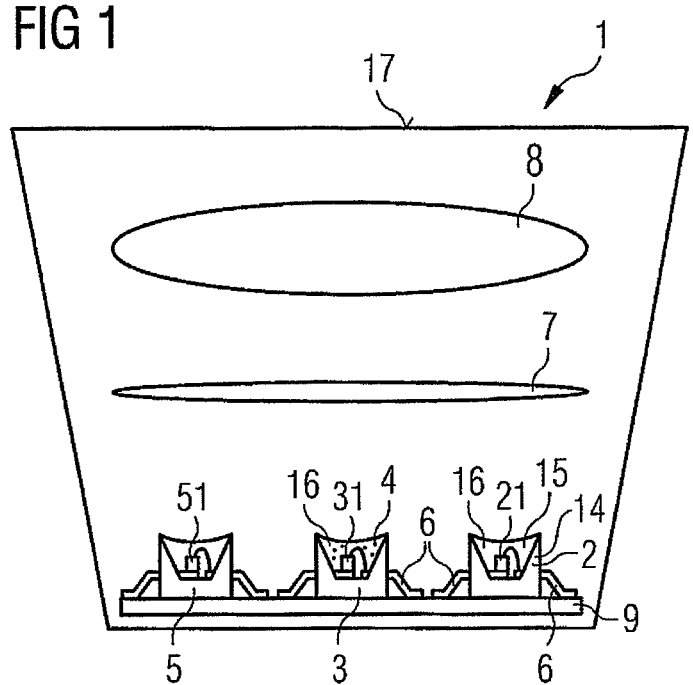
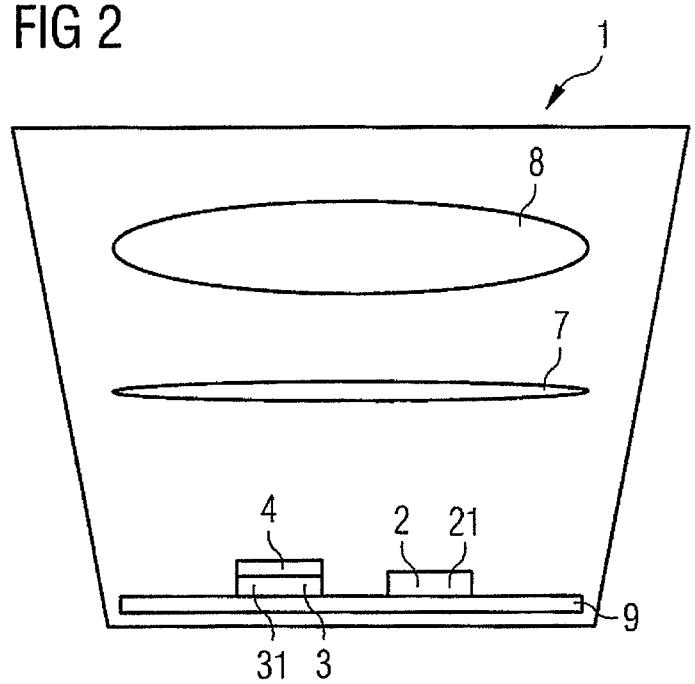

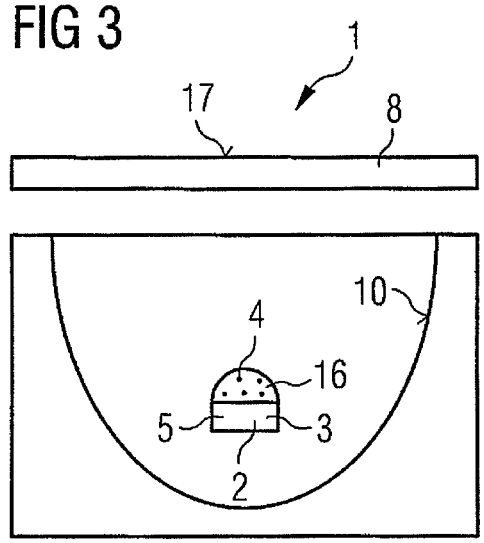
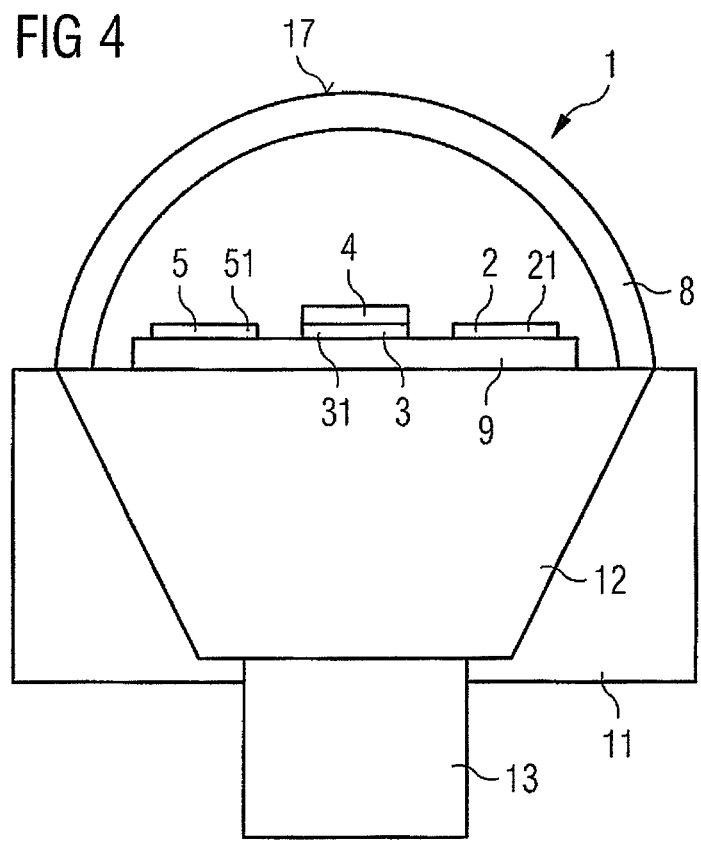

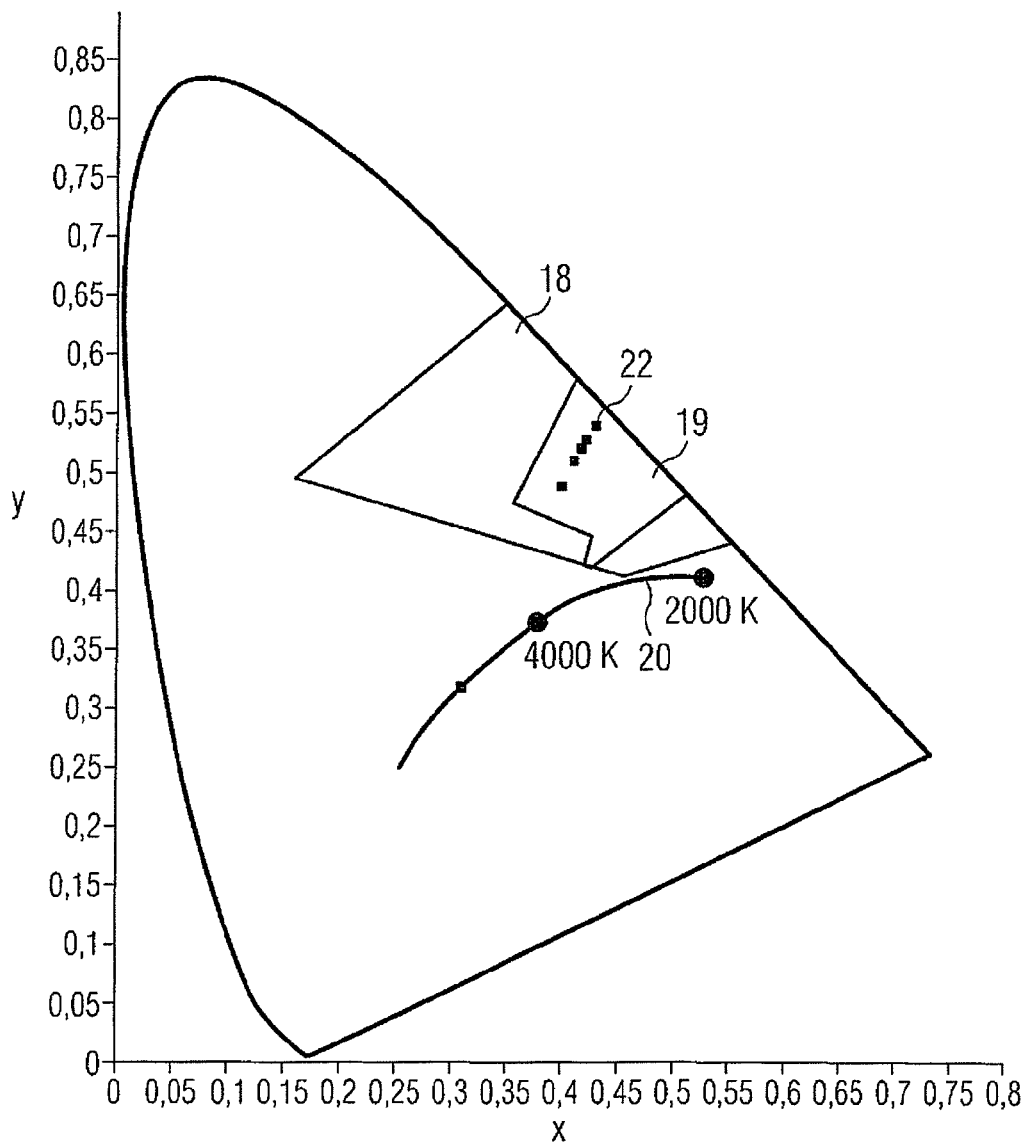

MIXED LIGHT SOURCE

This is a U.S. National Phase Application under 35 USC 371 of International Application PCT/EP2010/060255 filed on Jul. 15, 2010.

This application claims the priority of German Application No. 10 2009 047 789.6 filed Sep. 30, 2009, the entire content of which is hereby incorporated by reference.

The present application relates to a mixed light source, in particular a white light source.

White light sources based on light emitting diodes usually comprise semiconductor chips whose radiation is partly converted by conversion material in such a way that the secondary radiation thus produced together with the primary radiation emitted by the semiconductor chip results in a white color impression for the eye. However, these white light sources attain only a comparatively low color rendering index compared with conventional white light sources such as incandescent lamps.

One object of the present invention is to specify an efficient white light source having a high color rendering index.

This object is achieved by means of a mixed light source according to patent claim 1. The dependent patent claims relate to further configurations and developments.

In accordance with one embodiment, a mixed light source, in particular a white light source, comprises a first radiation source, which emits radiation in the red spectral range. Furthermore, the mixed light source comprises an excitation source, which contains a III-V semiconductor material, and a conversion substance. During operation of the mixed light source, the radiation of the excitation source is converted at least partly into radiation whose color locus in the CIE chromaticity diagram (1931 CIE standard chromaticity diagram) lies within a polygon spanned by the coordinates (0.1609; 0.497), (0.35; 0.6458), (0.558; 0.444) and (0.453; 0.415).

By mixing the radiation emitted by the conversion substance in the specified color range with the radiation of the first radiation source in the red spectral range, a mixed light source having a high color rendering index may be obtained.

The color rendering index Ra(8), that is to say the so-called "general color rendering index" determined with eight reference colors, can thus attain values of 85 or more upon determination in accordance with the German industrial standard DIN 6169, part 2.

In one preferred configuration, the color locus of the conversion substance in the CIE chromaticity diagram lies within a polygon spanned by the coordinates (0.43; 0.45), (0.42; 0.42), (0.512; 0.487), (0.416; 0.583) and (0.36; 0.48).

Secondary radiation in this color range is particularly suitable for realizing a white light source having a high color rendering index.

The conversion substance preferably contains at least one material whose composition is chosen from the material group $(Y,Gd,Tb,Cu)_3 (Al,Ga)_5 O_{12}:Ce$, respectively comprising at least one material from the materials mentioned between parentheses. Particularly preferably, the conversion substance contains a material from the material group $Y_3 (Al,Ga)_5 O_{12}:Ce$ or consists of such a material.

In one preferred configuration, the color locus of the mixed light source is tunable during operation, in particular along the curve of a black body radiator. In particular, the color locus of the mixed light source can be set between warm white (for example having a color temperature of 2700 K) and cold white (for example having a color temperature of 6500 K).

Preferably, the mixed light source is embodied in such a way that, along the curve of the black body radiator, the color rendering index in the range of 2700 K to 6500 K is at least 85.

The tuning of the color locus or of the color temperature can be effected during operation of the mixed light source by targeted control of the radiation components of the radiation emitted by the mixed light source.

The radiation generated by the first radiation source is preferably in the range of 612 nm and 630 nm inclusive, particularly preferably between 616 nm and 620 nm inclusive. In this case, the specified wavelength ranges relate to the dominant wavelength or peak wavelength of the radiation components of the first radiation source which are actually emitted during operation of the mixed light source.

It has been found that red radiation in the spectral range mentioned, in particular in combination with green radiation components in the ranges mentioned further above, is particularly suitable for a white light source having a high color rendering index.

In one preferred configuration, the first radiation source is formed by means of a III-V semiconductor material. In this case, the radiation in the red spectral range need not necessarily be generated directly by electroluminescence in the semiconductor material. Rather, the radiation in the red spectral range can also be emitted by a conversion material which converts the radiation emitted by the semiconductor material into radiation in the red spectral range.

In particular, the semiconductor material can be based on a phosphide compound semiconductor. In the present context, this means that the semiconductor body provided for generating radiation, in particular the active region, comprises material from the material system $Al_n Ga_m In_{1-n-m} P$, wherein $0 \le n \le 1$, $0 \le m \le 1$ and $n+m \le 1$, preferably where $n \ne 0$ and/or $m \ne 0$, hold true.

In this material system, red radiation can be generated particularly efficiently.

In one preferred configuration, in addition to the excitation source, a further radiation source is provided, which generates radiation in the blue spectral range. Preferably, the further radiation source generates radiation having a wavelength of at least 460 nm, particularly preferably between 465 nm and 470 nm inclusive.

By suitably setting the relative radiation components of the radiation emitted by the further radiation source, the first radiation source and by the conversion substance, a white light source which attains a high color rendering index in conjunction with high energy efficiency, that is to say high conversion efficiency of electrical power into optical radiation power that can be perceived by the human eye, may be realized.

In one configuration variant, the excitation source is embodied in such a way that it generates radiation having a dominant wavelength of at most 450 nm, in particular in the wavelength range of between 445 nm and 449 nm inclusive.

In this wavelength range, the primary radiation generated by the excitation source can be converted into visible radiation by the conversion substance particularly efficiently, in particular with a resulting total efficiency of more than 100 lm/W.

Furthermore, the mixed light source is preferably embodied in such a way that the radiation emitted by the excitation source is completely or at least almost completely absorbed and a largest possible proportion of said radiation is converted into visible radiation.

In this way, a situation where radiation which does not or does not significantly contribute to the brightness sensation of the human eye emerges from the mixed light source may be avoided. This is the case for example with blue radiation toward short wavelengths.

Through the combination of an excitation source with the further radiation source, which emits blue radiation having a wavelength that is greater than the wavelength of the excitation source, what is thus achieved is that radiation emitted by the conversion substance after excitation by the excitation source and the radiation in the blue spectral range are generated particularly efficiently. A white light source which is distinguished by a particularly high energy efficiency is thus realized.

In an alternative configuration variant, the excitation source is embodied in such a way that it generates radiation having a wavelength of at least 445 nm, particularly preferably 450 nm. In this case, the mixed light source can also be embodied in such a way that the primary radiation emitted by the excitation source is only partly absorbed by the conversion substance and partly emerges from the mixed light source.

The further radiation source, which emits radiation in the blue spectral range, can also be dispensed with in this case. This configuration is suitable, in particular, for a mixed light source whose color locus is already set during the production of said mixed light source. A mixed light source having a high color rendering index is thus realized in a particularly simple and cost-effective manner.

The excitation source is preferably based on nitride compound semiconductor material. In the present context, this means that the semiconductor body provided for generating the radiation, in particular the active region, preferably comprises $Al_nGa_mIn_{1-n-m}N$, wherein $0 \leq n \leq 1$, $0 \leq m \leq 1$ and $n+m \leq 1$, hold true, preferably where $n \neq 0$ and/or $m \neq 0$.

The excitation source and/or the first radiation source can be embodied, in particular, as an unpackaged semiconductor chip or as a packaged LED component, for example as a surface-mountable component (smd, surface mounted device) or with radial geometry.

In one preferred configuration, the mixed light source comprises a common intermixing structure through which the radiation generated in the mixed light source passes before emerging from the mixed light source. By means of the intermixing structure it is possible, in particular, to increase the spatial homogeneity with regard to the color locus of the radiation emitted by the mixed light source.

By way of example, the intermixing structure can be formed by means of a fly's eye condenser or by means of a diffuser element, for instance a diffuser plate or a plurality of microlenses.

Alternatively or supplementarily, the radiation can be intermixed by means of a reflector, wherein the reflector preferably has a structured, for example faceted, surface.

Furthermore, the mixed light source can comprise an optical element for beam shaping. By way of example, the optical element can be provided for directional emission at a predetermined emission angle, for instance at a solid angle of between 20° and 40° inclusive, for example 30°.

In this case, the optical element can be embodied separately from the intermixing structure or in a manner integrated into the intermixing structure.

In one configuration variant, the conversion substance is integrated into the excitation source. By way of example, the conversion substance can be embedded into a potting surrounding the semiconductor chip of the excitation source. Alternatively, the conversion substance can be embodied, for example, as a plate arranged on the semiconductor chip.

In an alternative configuration, the conversion substance is formed in a manner spaced apart from the excitation source. In this way, during operation of the mixed light source, heating of the conversion substance on account of the power loss of the excitation source may be reduced. A high conversion efficiency in the conversion substance and a particularly stable color locus of the secondary radiation are thus obtained.

The conversion substance can also be integrated into the intermixing structure, such that the latter can serve both for radiation conversion and for spatial homogenization of the color locus.

Further features, configurations and expediencies will become apparent from the following description of the exemplary embodiments in conjunction with the figures.

In the figures:

FIG. 1 shows a first exemplary embodiment of a mixed light source in schematic

FIG. 2 shows a second exemplary embodiment of a mixed light source in schematic sectional view, FIG. 3 shows a third exemplary embodiment of a mixed light source in schematic sectional view, FIG. 4 shows a fourth exemplary embodiment of a mixed light source in schematic sectional view, and FIG. 5 shows an illustration of the color loci of the radiation emitted by the conversion substance in the CIE chromaticity diagram.

Elements which are identical, of identical type or act identically are provided with the same reference symbols in the figures. The figures and the size relationships of the elements illustrated in the figures among one another should not be regarded as to scale. Rather, individual elements may be illustrated with an exaggerated size in order to enable better illustration and/or in order to afford a better understanding.

A first exemplary embodiment of a mixed light source is illustrated in schematic sectional view in FIG. 1. The mixed light source 1 comprises a carrier 9. A first radiation source 2 is arranged on the carrier, said first radiation source being embodied by way of example as a surface-mountable LED component.

By way of example, a circuit board, for instance a printed circuit board (pcb), is suitable as the carrier.

Said first radiation source 2 comprises a semiconductor chip 21, which is based on InGaAlP and during operation generates radiation in the red spectral range, preferably in the radiation range of between 612 nm and 630 nm inclusive, particularly preferably between 616 nm and 620 nm inclusive. Alternatively, the radiation in the red spectral range can also be generated by means of a converter material. In this case, the semiconductor chip is expediently provided for the generation of a shorter wavelength at which the converter material has a high absorption efficiency.

The LED component furthermore comprises a housing body 14 having a recess 15, in which the semiconductor chip is arranged. The semiconductor chip 21 is electrically conductively connected to the carrier via two connection conductors 6. For protection against external environmental influences, the semiconductor chip 21 is surrounded by an encapsulation 16. For example a resin, in particular a reaction resin, for example epoxy resin, or a silicone is suitable as encapsulation material.

Furthermore, the mixed light source comprises an excitation source 3, which, by way of example, is likewise embodied as a packaged LED component having a semiconductor chip 31 provided for generating radiation.

A conversion substance 4 is embedded in the encapsulation 16, which conversion substance, during operation of the mixed light source, converts at least part of the radiation generated by the semiconductor chip 31 into secondary radiation.

The color locus of said secondary radiation lies in a color range, the CIE chromaticity diagram, is bounded by a polygon having the corner points (0.1609; 0.497), (0.35; 0.6458), (0.558; 0.444) and (0.453; 0.415). Said polygon is illustrated as region 18 in the CIE chromaticity diagram illustrated in FIG. 5.

Particularly preferably, the color locus of said secondary radiation lies in a polygon spanned by the coordinates (0.43; 0.45), (0.42; 0.42), (0.512; 0.487), (0.416; 0.583) and (0.36; 0.48). Said polygon is illustrated as partial region 19 in FIG. 5.

In particular a conversion substance which contains a material or consists of a material whose composition is chosen from the material group $(Y,Gd,Th,Cu)_3 (Al,Ga)_5 O_{12}:Ce$, for example from $Y_3 (Al,Ga)_5 O_{12}:Ce$ is suitable for this purpose.

In this exemplary embodiment, the semiconductor chip 31 of the excitation source is based on AlInGaN and is embodied for generating an excitation wavelength of at most 450 nm, preferably between 445 and 449 nm inclusive. The conversion substance 4 can be excited particularly efficiently in this spectral range.

Furthermore, the mixed light source 1 comprises a further radiation source 5, which is likewise embodied as a packaged LED component. The further radiation source 5 comprises a semiconductor chip 51 provided for generating radiation in the blue spectral range, in particular having a wavelength of at least 460 nm.

Preferably, the radiation emitted by the further radiation source is in a wavelength range of between 465 nm and 470 nm inclusive.

The radiation generated by the semiconductor chip 31 of the excitation source 3 is preferably converted completely by the conversion substance 4 into radiation in the yellow-green color range (partial region 19 in FIG. 5).

Spectral components in the red, yellow-green and blue spectral range are therefore available during operation of the mixed light source, such that, by suitable adaptation of the intensity proportions of the three LED components, mixed light can be generated which leaves a white color impression for the human eye. In this case, through combination of the color components in the spectral ranges respectively mentioned further above, a mixed light source having a very high color rendering index may be obtained.

Furthermore, a mixed light source wherein, during operation, the color locus is tunable, in particular along the curve of a black body radiator, is thus realized in a simple manner. The color rendering index Ra(8) can be, in particular in the range of 2700 K to 6500 K, at least 85 throughout.

The radiation components emerging from the LED components from the encapsulation 16, which can in each case fulfill the function of a primary optical unit, are collimated by a common secondary optical unit 7, which can be embodied as a lens, for example, and are fed to an intermixing structure 8. By way of example, a fly's eye condenser is suitable as the intermixing structure. What is achieved by means of the intermixing structure is that the radiation emerging from a radiation exit surface 17 of the mixed light source has a high homogeneity with regard to the color locus along the exit surface. In particular, white light can thus emerge in a manner free of so-called color shadows from the mixed light source.

The radiation emitted by the mixed light source 1 can emerge from the mixed light source for example at a solid angle of approximately 30 degrees.

In this exemplary embodiment, the conversion substance 4 is embedded into the encapsulation 16 of the semiconductor chip 31. The conversion substance is therefore integrated into the excitation source 3 embodied as an LED component. In a departure from this, however, the conversion substance can also be spaced apart from the excitation source 3 and can be embodied in a manner integrated into the intermixing structure 8, for example. Waste heat generated by the excitation source 3 during operation of the mixed light source therefore does not lead to a significant change in the temperature of the conversion substance. A high conversion efficiency and at the same time a constant color locus of the radiation emitted by the conversion substance can be obtained in this way.

In this first exemplary embodiment, the mixed light source comprises only one LED component per radiation component merely for the sake of simplicity. In order to increase the total radiation power emitted by the mixed light source, it is also possible, of course, to provide a plurality of LED components.

A second exemplary embodiment of a mixed light source is illustrated in schematic sectional view in FIG. 2. This exemplary embodiment substantially corresponds to the first exemplary embodiment illustrated in connection with FIG. 1. In contrast thereto, the first radiation source 2 and the excitation source 3 are each embodied as semiconductor chips 21 and 31, respectively, which are fixed on the carrier 9 in an unpackaged fashion.

The conversion substance 4 is formed on the semiconductor chip 31 of the excitation source 3. By way of example, the conversion substance can be embodied as a conversion plate fixed to the semiconductor chip 31. Alternatively, the conversion substance can, for example, also be embodied in a conversion layer which is applied, for example by vapor deposition or printing, on the semiconductor chip during the production of the mixed light source.

Furthermore, in contrast to the exemplary embodiment illustrated in connection with FIG. 1, the mixed light source does not comprise a separate further radiation source provided for generating radiation in the blue spectral range. In this case, semiconductor chip 31 of the excitation source and conversion substance 4 are coordinated with one another in such a way that the conversion substance converts the primary radiation of the semiconductor chip only partly into yellow-green radiation.

Here, the emission wavelength of the semiconductor chip 31 of the excitation source 3 is preferably at least 445 nm, particularly preferably at least 450 nm.

The mixed light source 1 thus makes available the primary radiation of the semiconductor chip 31 of the excitation source 3, the secondary radiation of the conversion substance 4 and also the red radiation of the first radiation source 2. By suitably adapting the ratios of these three radiation components, a white light source which has a high color rendering index of more than 85 and which at the same time is particularly simple and cost-effective to produce may be realized.

It goes without saying that the configuration of the first radiation source and of the excitation source as unpackaged semiconductor chips as described in this exemplary embodiment can also be applied in the first exemplary embodiment described in connection with FIG. 1.

Furthermore, an intermediate carrier (submount) can also be embodied (not explicitly illustrated) in each case between the semiconductor chips 21, 31 and the carrier 9. The intermediate carrier can, for example, contain a ceramic, for instance AlN or BN, or consist of a ceramic. Ceramic is distinguished firstly by a high mechanical stability and secondly by a high thermal conductivity, such that the heat loss generated in the semiconductor chip can be efficiently dissipated from the semiconductor.

A third exemplary embodiment of a mixed light source is illustrated schematically in sectional view in FIG. 3. This exemplary embodiment substantially corresponds to the first exemplary embodiment illustrated in connection with FIG. 1. In contrast thereto, the semiconductor chip of the first radiation source 2, the semiconductor chip of the excitation source 3 and also the semiconductor chip of the further radiation source 5 are arranged in a common LED component. For improved clarity, the semiconductor chips are not explicitly illustrated in this figure.

Furthermore, the conversion substance 4 is embedded into the encapsulation 16, such that the radiation components in the red, blue and yellow-green to green spectral range can emerge from an individual LED component. In order to increase the optical power of the white light source, the latter can once again comprise a plurality of such LED components. The LED component or, if appropriate, the LED components is or are arranged within a reflector 10. The reflector 10 is preferably embodied in structured fashion, in particular in faceted fashion. In this way, an intermixing of the different spectral components of the mixed light source is realized in a simplified manner. Furthermore, the reflector can also be embodied as diffusely reflective.

On the part of the radiation exit surface 17 of the mixed light source 1, a diffuser element is arranged as intermixing structure 8. The diffuser element can be embodied, for example, as a diffuser placed or as a matrix of microlenses. As a result, the homogeneity of the emitted radiation with regard to the color locus is increased more extensively.

The reflector described is also suitable, of course, for an embodiment of the mixed light source wherein the individual radiation sources as described in connection with FIG. 1 are produced by separate LED components or by unpackaged LED semiconductor chips.

A fourth exemplary embodiment of a mixed light source is illustrated schematically in sectional view in FIG. 4, wherein the mixed light source is embodied as an LED lamp. The mixed light source comprises a lamp body 11, in which a heat sink 12 is formed. The radiation sources arranged on the carrier 9 can in this case be embodied as described in connection with FIGS. 1 and 2.

On the side remote from the radiation exit surface 17, the lamp body comprises a mount 13 suitable for holders of conventional white light sources, for example incandescent lamps. The mount can be embodied for example as a thread that can be screwed into an E14 or E27 incandescent lamp holder.

In this exemplary embodiment, the intermixing structure 8 is embodied as a diffuse covering through which the radiation generated during operation emerges from the mixed light source spatially homogeneously relative to the color locus.

Furthermore, an electronic controller is preferably integrated into the lamp body, such that the mixed light source can be operated with conventional power supply voltages, for instance 110 V or 220 V. The electronic controller can also be provided for controlling the relative color components and thus for setting the color locus of the mixed light source.

FIG. 5 shows in the CIE diagram by way of example the results of some measurements of color loci 22 of LED components in which a semiconductor chip as excitation source generates primary radiation in the blue spectral range and in which the concentration of the conversion substance was varied. The measurements show that, by means of a suitably high concentration of the conversion substance, the emitted radiation lies within the partial region 19, which, as described in connection with FIG. 1 is particularly suitable for the realization of a white light source having a high color rendering index.

Furthermore, FIG. 5 illustrates the profile of the color locus of a black body radiator as a function of the temperature as curve 20, wherein the color loci for the color temperature 2000 K and for 4000 K are entered by way of example.

The mixed light source described above makes it possible to set the color locus in particular along said curve 20, wherein between 2700 K and 6500 K the color rendering index Ra(8) attains values of greater than 85, in wide ranges even greater than 90.

This patent application claims the priority of German patent application 10 2009 047 789.6, the disclosure content of which is hereby incorporated by reference.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention clamed is:

1. A mixed light source comprising:
a first radiation source, which emits radiation in the red spectral range;
an excitation source, comprising a III-V semiconductor material;
a conversion substance, which, during the operation of the mixed light source, converts the radiation of the excitation source at least partly into radiation having a defined color locus; and
a further radiation source which generates radiation in the blue spectral range, wherein:
the further radiation source generates radiation having a dominant wavelength of between 465 nm and 470 nm inclusive, and
the excitation source generates radiation having a dominant wavelength of between 445 nm and 449 nm inclusive.

2. The mixed light source according to claim 1,
wherein the color locus of the conversion substance in the CIE chromaticity diagram lies within a polygon spanned by the coordinates (0.43; 0.45), (0.42; 0.42), (0.512; 0.487), (0.416; 0.583) and (0.36; 0.48).

3. The mixed light source according to claim 1,
wherein the first radiation source emits radiation in the range of between 612 nm and 630 nm inclusive.

4. The mixed light source according to claim 1, wherein the first radiation source emits radiation in the range of between 616 nm and 620 nm inclusive.

5. The mixed light source according to claim 1, wherein the first radiation source is formed by means of a semiconductor material based on phosphide compound semiconductors.

6. The mixed light source according to claim 1,
wherein the excitation source generates radiation having a dominant wavelength of at most 450 nm and the further radiation source generates radiation having a wavelength of at least 460 nm.

7. The mixed light source according to claim 1, wherein the conversion substance is formed in a manner spaced apart from the excitation source.

8. The mixed light source according to claim 1, wherein the color locus of the mixed light source is tunable during operation along the curve of a black body radiator.

9. The mixed light source according to claim 8, wherein, along the curve of the black body radiator, the color rendering index Ra(8) in the range of 2700 K to 6500 K is at least 85.

10. The mixed light source according to claim 1,
   wherein the radiation generated in the mixed light source passes through a common intermixing structure before emerging from the mixed light source.

11. The mixed light source according to claim 1, wherein the color locus of the conversion substance in the CIE chromaticity diagram lies within a polygon spanned by the coordinates (0.43; 0.45), (0.42; 0.42), (0.512; 0.487), (0.416; 0.583) and (0.36; 0.48), and
   wherein the first radiation source emits radiation in the range of between 616 nm and 620 nm inclusive.

12. The light source according to claim 1, wherein the conversion substance comprises a material whose composition is chosen from the material group $(Y, Gd, Th, Cu)_3 (Al, Ga)_5 O_{12}$:Ce.

* * * * *